US010280302B2

(12) United States Patent
Ha et al.

(10) Patent No.: US 10,280,302 B2
(45) Date of Patent: May 7, 2019

(54) THERMOPLASTIC RESIN COMPOSITION AND ARTICLE PRODUCED THEREFROM

(71) Applicant: Lotte Advanced Materials Co., Ltd., Yeosu-si (KR)

(72) Inventors: Dong In Ha, Uiwang-si (KR); Tae Gon Kang, Uiwang-si (KR); Seung Shik Shin, Uiwang-si (KR); Da Heen Jeong, Uiwang-si (KR); Ki Hong Choi, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 0 days.

(21) Appl. No.: 15/797,159

(22) Filed: Oct. 30, 2017

(65) Prior Publication Data

US 2018/0118935 A1 May 3, 2018

(30) Foreign Application Priority Data

Nov. 2, 2016 (KR) ........................ 10-2016-0144935
Jun. 29, 2017 (KR) ........................ 10-2017-0082542

(51) Int. Cl.

*C08L 51/00* (2006.01)
*C08L 69/00* (2006.01)
*C08L 63/00* (2006.01)
*H05K 5/02* (2006.01)
*H05K 5/04* (2006.01)
*C08K 3/04* (2006.01)
*C08K 3/26* (2006.01)
*C08K 3/34* (2006.01)
*C08K 5/52* (2006.01)

(52) U.S. Cl.

CPC ............ *C08L 63/00* (2013.01); *H05K 5/0217* (2013.01); *H05K 5/04* (2013.01); *C08K 3/04* (2013.01); *C08K 3/26* (2013.01); *C08K 3/34* (2013.01); *C08K 5/52* (2013.01); *C08L 2201/02* (2013.01); *C08L 2203/20* (2013.01)

(58) Field of Classification Search

None
See application file for complete search history.

(56) References Cited

U.S. PATENT DOCUMENTS

2009/0312479 A1* 12/2009 Ren ........................ C08L 69/00 524/451
2016/0280910 A1 9/2016 Erkelenz et al.
2017/0283611 A1 10/2017 Iida et al.

FOREIGN PATENT DOCUMENTS

JP 2015-028135 A 2/2015
WO 2013/100303 A1 7/2013
WO 2015/074233 A1 5/2015
WO 2016/042426 A1 3/2016

OTHER PUBLICATIONS

Extended Search Report in counterpart European Application No. 17199638.2 dated Mar. 14, 2018, pp. 1-6.

* cited by examiner

*Primary Examiner* — Ana L. Woodward
(74) *Attorney, Agent, or Firm* — Additon, Higgins & Pendleton, P.A.

(57) ABSTRACT

A thermoplastic resin composition includes: about 100 parts by weight of a polycarbonate resin; about 1 to about 15 parts by weight of a rubber-modified vinyl copolymer resin; about 10 to about 30 parts by weight of a phosphorus flame retardant; about 3 to about 12 parts by weight of calcium carbonate; about 5 to about 40 parts by weight of talc; and about 0.001 to about 5 parts by weight of a black pigment, wherein a weight ratio of calcium carbonate to talc ranges from about 1:1.5 to about 1:6 and the black pigment has an average particle size of about 10 nm to about 24 nm. The thermoplastic resin composition can realize high gloss and good appearance characteristics, and can exhibit good properties in terms of flowability, impact resistance, thermal resistance, thin film flame retardancy, dimensional stability, and the like.

10 Claims, 1 Drawing Sheet

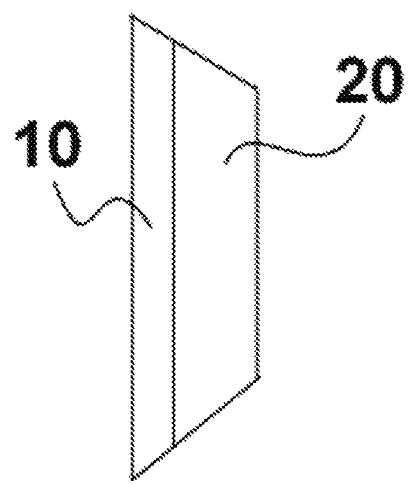
20
10

THERMOPLASTIC RESIN COMPOSITION AND ARTICLE PRODUCED THEREFROM

CROSS-REFERENCE TO RELATED APPLICATIONS

This application claims priority under 35 USC Section 119 to and the benefit of Korean Patent Application 10-2016-0144935, filed on Nov. 2, 2016, and Korean Patent Application No. 10-2017-0082542, filed Jun. 29, 2017, the entire disclosures of each of which are incorporated herein by reference.

FIELD

The present invention relates to a thermoplastic resin composition and a molded article produced therefrom.

BACKGROUND

Thermoplastic resins exhibit excellent properties, such as low specific gravity, good moldability, and good impact resistance, as compared with glass or metal, and are useful for housings of electrical/electronic products, automotive interior/exterior materials, and exterior materials for buildings. With the trend toward larger and lighter electrical/electronic products, plastic products produced from thermoplastic resins are quickly replacing existing glass and metal-based products.

A PC/ABS-based thermoplastic resin composition prepared by blending a polycarbonate (PC) resin with a rubber-modified aromatic vinyl copolymer such as an acrylonitrile-butadiene-styrene (ABS) copolymer resin can improve processability and chemical resistance of the polycarbonate resin with minimal or no deterioration in impact resistance and thermal resistance of the polycarbonate resin, and can achieve cost reduction, thereby enabling various applications thereof.

Such a thermoplastic resin composition may include a flame retardant and inorganic fillers such as glass fibers, talc, and wollastonite in order to improve rigidity and flame retardancy.

However, the thermoplastic resin composition containing the inorganic fillers such as glass fibers can suffer from deterioration in flowability and elongation, and it can be difficult to provide a good external appearance due to a concern of protrusion of the glass fibers.

Therefore, there is a need for a thermoplastic resin composition that can realize high gloss and good external appearance and can exhibit good properties in terms of flowability, impact resistance, thermal resistance, thin film flame retardancy, dimensional stability, and the like.

SUMMARY OF THE INVENTION

Exemplary embodiments provide a thermoplastic resin composition, which can realize high gloss and good external appearance and can exhibit good properties in terms of flowability, impact resistance, thermal resistance, thin film flame retardancy and dimensional stability, and a molded article produced therefrom.

The thermoplastic resin composition includes: about 100 parts by weight of a polycarbonate resin; about 1 to about 15 parts by weight of a rubber-modified vinyl copolymer resin; about 10 to about 30 parts by weight of a phosphorus flame retardant; about 3 to about 12 parts by weight of calcium carbonate; about 5 to about 40 parts by weight of talc; and about 0.001 to about 5 parts by weight of a black pigment, wherein a weight ratio of calcium carbonate to talc ranges from about 1:1.5 to about 1:6 and the black pigment has an average particle size of about 10 nm to about 24 nm.

In exemplary embodiments, the rubber-modified vinyl copolymer resin may include a rubber-modified aromatic vinyl graft copolymer obtained by grafting an aromatic vinyl monomer and an alkyl (meth)acrylate monomer to a rubber polymer.

In exemplary embodiments, the phosphorus flame retardant may include at least one selected from among phosphate, phosphonate, phosphinate, phosphine oxide, and phosphazene compounds.

In exemplary embodiments, the rubber-modified vinyl copolymer resin may be present in a lower amount than the phosphorus flame retardant.

In exemplary embodiments, the thermoplastic resin composition may have a melt-flow index (MI) of about 30 g/10 min to about 50 g/10 min, as measured at 220° C. under a load of 5 kgf in accordance with ASTM D1238, and a notched Izod impact strength of about 5 kgf·cm/cm or more, as measured on a ⅛" thick specimen in accordance with ASTM D256.

In exemplary embodiments, the thermoplastic resin composition may have a glass transition temperature of about 82° C. to about 90° C. and a flame retardancy of V1 or higher, as measured on a 1.0 mm thick specimen in accordance with the UL94 standard.

In exemplary embodiments, the thermoplastic resin composition may have a coefficient of linear expansion of about 20 cm/cm° C. to about 45 cm/cm° C., as measured on a 6.4 mm thick flexural specimen at 90° C. in accordance with ASTM D696, and a longitudinal length of about 390 mm to about 400 mm, as measured on a specimen prepared by injection molding at a temperature of 260° C. and at each holding pressure (30 bar, 50 bar and 70 bar) using a luminous mold having a size of 400 mm×100 mm×10 mm (length×width×thickness) so as not to form burrs, and left at 23° C. for 24 hours.

In exemplary embodiments, the thermoplastic resin composition may have a gloss (60°) of about 95% to about 100%, as measured on an injection molded specimen at an angle of 60° in accordance with ASTM D523, and a luminance (L*) of about 90 to about 100, a* of about −0.1 to about 0.3, and b* of about −0.1 to about 0.3, as measured on a 3.2 mm thick specimen in accordance with ASTM D2244.

Other embodiments relate to a molded article. The molded article is formed from the thermoplastic resin composition.

In exemplary embodiments, the molded article may be a plastic member of a housing of an electronic product that includes a metal frame and the plastic member adjoining at least one surface of the metal frame.

BRIEF DESCRIPTION OF THE DRAWINGS

FIG. 1 is a schematic side-sectional view of a housing of an electronic product according to one embodiment of the present invention.

DETAILED DESCRIPTION

The above and other aspects, features, and advantages of the present invention will become apparent from the detailed description of the following embodiments. It should be understood that the present invention is not limited to the following embodiments and may be embodied in different ways, and that the embodiments are provided for complete disclosure and thorough understanding of the present invention by those skilled in the art. The scope of the present invention should be defined only by the appended claims.

Hereinafter, embodiments of the present invention will be described in detail.

A thermoplastic resin composition according to the present invention includes (A) a polycarbonate resin; (B) a rubber-modified vinyl copolymer resin; (C) a phosphorus flame retardant; (D) calcium carbonate; (E) talc; and (F) a black pigment.

(A) Polycarbonate Resin

According to exemplary embodiments, the polycarbonate resin may be a polycarbonate resin used for typical thermoplastic resin compositions. For example, the polycarbonate resin may be an aromatic polycarbonate resin prepared by reacting one or more diphenols (aromatic diol compounds) with a carbonate precursor, such as phosgene, halogen formate, and/or carbonate diester.

Examples of the diphenols may include 4,4'-biphenol, 2,2-bis(4-hydroxyphenyl)propane, 2,4-bis(4-hydroxyphenyl)-2-methylbutane, 1,1-bis(4-hydroxyphenyl)cyclohexane, 2,2-bis(3-chloro-4-hydroxyphenyl)propane, 2,2-bis(3,5-dichloro-4-hydroxyphenyl)propane, and the like, and mixtures thereof, without being limited thereto. For example, the diphenol(s) may include 2,2-bis(4-hydroxyphenyl)propane, 2,2-bis(3,5-dichloro-4-hydroxyphenyl)propane, and/or 1,1-bis(4-hydroxyphenyl)cyclohexane, for example 2,2-bis-(4-hydroxyphenyl)-propane, which is also referred to as bisphenol A.

In exemplary embodiments, the polycarbonate resin may be a branched polycarbonate resin. For example, the branched polycarbonate resin may be prepared by adding a tri- or higher polyfunctional compound, for example, a tri- or higher valent phenol group-containing compound, in an amount of 0.05 mol % to 2 mol % based on the total number of moles of the diphenols used in polymerization.

In exemplary embodiments, the polycarbonate resin may be a homopolycarbonate resin, a copolycarbonate resin, and/or a blend thereof. In addition, the polycarbonate resin may be partly or completely replaced by an aromatic polyester-carbonate resin obtained by polymerization in the presence of an ester precursor, for example, a bifunctional carboxylic acid.

In exemplary embodiments, the polycarbonate resin may have a weight average molecular weight (Mw) of about 10,000 g/mol to about 50,000 g/mol, for example, about 15,000 g/mol to about 40,000 g/mol, as measured by gel permeation chromatography (GPC). Within this range, the thermoplastic resin composition can have good flowability (processability).

In exemplary embodiments, the polycarbonate resin may have a melt-flow index (MI) of about 5 g/10 min to about 80 g/10 min, as measured at 300° C. under a load of 1.2 kgf in accordance with ISO 1133. The polycarbonate resin may be a mixture of two or more polycarbonate resins having different melt-flow indexes.

(B) Rubber-Modified Vinyl Copolymer Resin

The rubber-modified vinyl copolymer resin may be a rubber-modified aromatic vinyl graft copolymer (B1) obtained by grafting an aromatic vinyl monomer and an alkyl (meth)acrylate monomer to a rubber polymer, and/or a mixture of the rubber-modified aromatic vinyl graft copolymer (B1) and an aromatic vinyl copolymer resin (B2).

As used herein, unless otherwise stated, the term "(meth)acryl" may refer to both "acryl" and "methacryl". For example, the term "(meth)acrylate" may refer to both "acrylate" and "methacrylate".

(B1) Rubber-Modified Aromatic Vinyl Graft Copolymer

According to exemplary embodiments, the rubber-modified aromatic vinyl graft copolymer may be obtained by adding the aromatic vinyl monomer and alkyl (meth)acrylate monomer to the rubber polymer, and optionally adding monomers for imparting processability and thermal resistance thereto, as needed, followed by polymerization (graft copolymerization). Here, polymerization may be performed by any typical known polymerization method, such as emulsion polymerization, suspension polymerization, bulk polymerization, and the like. As used herein, the term "alkyl" refers to C1-C10 alkyl.

Examples of the rubber polymer may include: diene rubbers such as polybutadiene, poly(styrene-butadiene), and/or poly(acrylonitrile-butadiene); saturated rubbers such as obtained by adding hydrogen to the diene rubbers; isoprene rubbers; acrylic rubbers such as poly(butyl acrylate); ethylene-propylene-diene monomer terpolymers (EPDM), and the like, without being limited thereto. These may be used alone or as a mixture thereof. For example, the rubber polymer may be a diene rubber, for example a butadiene rubber.

The rubber-modified aromatic vinyl graft copolymer may include the rubber polymer in an amount of about 20 percent by weight (wt %) to about 70 wt %, for example, about 30 wt % to about 65 wt %, based on the total weight (100 wt %) of the rubber-modified aromatic vinyl graft copolymer. In some embodiments, the rubber-modified aromatic vinyl graft copolymer may include the rubber polymer in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments, the amount of the rubber polymer can be in a range from about any of the foregoing amounts to about any other of the foregoing amounts.

Within this range, the thermoplastic resin composition can exhibit good properties in terms of impact resistance, mechanical properties, and the like.

The rubber polymer (rubber particles) may have an average (z-average) particle size of about 0.05 μm to about 6 μm, for example, about 0.15 μm to about 4 μm, and as another example about 0.25 μm to about 3.5 μm. Within this range, the thermoplastic resin composition can exhibit good properties in terms of impact resistance, appearance, and flame retardancy. As used herein, the average (z-average) particle size was measured by a dry method known in the art using a Mastersizer 2000E series tester (Malvern).

The aromatic vinyl monomer is graft-copolymerizable with a rubber copolymer and may include, for example, styrene, α-methylstyrene, β-methylstyrene, p-methylstyrene, p-t-butylstyrene, ethylstyrene, vinylxylene, monochlorostyrene, dichlorostyrene, dibromostyrene, vinyl naphthalene, and the like, without being limited thereto. These may be used alone or as a mixture thereof.

The rubber-modified aromatic vinyl graft copolymer may include the aromatic vinyl monomer in an amount of about 5 wt % to about 40 wt %, for example, about 10 wt % to about 30 wt %, based on the total weight (100 wt %) of the rubber-modified aromatic vinyl graft copolymer. In some embodiments, the rubber-modified aromatic vinyl graft copolymer may include the aromatic vinyl monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments, the amount of the aromatic vinyl monomer can be in a range from about any of the foregoing amounts to about any other of the foregoing amounts.

Within this range, the thermoplastic resin composition can exhibit good properties in terms of fatigue resistance, impact resistance, mechanical properties, and the like.

Examples of the alkyl (meth)acrylate monomer may include methyl (meth)acrylate, ethyl (meth)acrylate, propyl (meth)acrylate, and the like and mixtures thereof, without being limited thereto. These may be used alone or as a mixture thereof. For example, the alkyl (meth)acrylate monomer may be methyl (meth)acrylate, for example methyl methacrylate.

The rubber-modified aromatic vinyl graft copolymer may include the alkyl (meth)acrylate monomer in an amount of about 1 wt % to about 35 wt %, for example, about 5 wt % to about 30 wt %, based on the total weight (100 wt %) of the rubber-modified aromatic vinyl graft copolymer. In some embodiments, the rubber-modified aromatic vinyl graft copolymer may include the alkyl (meth)acrylate monomer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, or 35 wt %. Further, according to some embodiments, the amount of the alkyl (meth)acrylate monomer can be in a range from about any of the foregoing amounts to about any other of the foregoing amounts.

Within this range, the thermoplastic resin composition can exhibit good properties in terms of impact resistance, mechanical properties, and the like.

Examples of the monomer(s) for imparting processability and thermal resistance may include: vinyl cyanide compounds, such as acrylonitrile, methacrylonitrile, ethacrylonitrile, phenyl acrylonitrile, α-chloroacrylonitrile, and/or fumaronitrile; acrylic acid, maleic anhydride, N-substituted maleimide, and the like, without being limited thereto. These may be used alone or as a mixture thereof.

The rubber-modified aromatic vinyl graft copolymer may include the monomer(s) for imparting processability and thermal resistance in an amount of about 15 wt % or less, for example, about 0.1 wt % to about 10 wt %, based on the total weight (100 wt %) of the rubber-modified aromatic vinyl graft copolymer. In some embodiments, the rubber-modified aromatic vinyl graft copolymer may include the monomer(s) for imparting processability and thermal resistance in an amount of 0 (the monomer(s) are not present), about 0 (the monomer(s) are present), 0.1, 0.2, 0.3, 0.4, 0.5, 0.6, 0.7, 0.8, 0.9, 1, 2, 3, 4, 5, 6, 7, 8, 9, 10, 11, 12, 13, 14, or 15 wt %. Further, according to some embodiments, the amount of the monomer(s) for imparting processability and thermal resistance can be in a range from about any of the foregoing amounts to about any other of the foregoing amounts.

Within this range, the thermoplastic resin composition can have good properties in terms of processability, heat resistance, and impact resistance without deterioration in other properties.

In exemplary embodiments, the rubber-modified vinyl copolymer resin may include the rubber-modified aromatic vinyl graft copolymer in an amount of about 60 wt % or more, for example, about 80 wt % to about 100 wt %, based on the total weight (100 wt %) of the rubber-modified vinyl copolymer resin. In some embodiments, the rubber-modified vinyl copolymer resin may include the rubber-modified aromatic vinyl graft copolymer in an amount of about 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 wt %. Further, according to some embodiments, the amount of the rubber-modified aromatic vinyl graft copolymer can be in a range from about any of the foregoing amounts to about any other of the foregoing amounts.

Within this range, the thermoplastic resin composition can exhibit good properties in terms of impact resistance, mechanical properties, and flowability.

(B2) Aromatic Vinyl Copolymer Resin

According to exemplary embodiments, the aromatic vinyl copolymer resin may be an aromatic vinyl copolymer resin used for a typical rubber-modified vinyl copolymer resin. For example, the aromatic vinyl copolymer resin may be a polymer of a monomer mixture including an aromatic vinyl monomer and a monomer copolymerizable with the aromatic vinyl monomer, such as a vinyl cyanide monomer.

In exemplary embodiments, the aromatic vinyl copolymer resin may be obtained by mixing the aromatic vinyl monomer and the monomer copolymerizable with the aromatic vinyl monomer, followed by polymerization. Here, polymerization may be performed by any typical known polymerization method, such as emulsion polymerization, suspension polymerization, bulk polymerization, and the like.

Examples of the aromatic vinyl monomer may include styrene, α-methylstyrene, β-methylstyrene, p-methylstyrene, p-t-butylstyrene, ethylstyrene, vinylxylene, monochlorostyrene, dichlorostyrene, dibromostyrene, vinyl naphthalene, and the like, without being limited thereto. These may be used alone or as a mixture thereof.

The aromatic vinyl copolymer resin may include aromatic vinyl monomer in an amount of about 20 wt % to about 90 wt %, for example, about 30 wt % to about 80 wt %, based on the total weight (100 wt %) of the aromatic vinyl copolymer resin. In some embodiments, the aromatic vinyl copolymer resin may include aromatic vinyl monomer in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments, the amount of the aromatic vinyl monomer can be in a range from about any of the foregoing amounts to about any other of the foregoing amounts.

Within this range, the thermoplastic resin composition can exhibit good properties in terms of impact resistance, flowability, and the like.

Examples of the monomer copolymerizable with the aromatic vinyl monomer may include vinyl cyanide compounds, such as acrylonitrile, methacrylonitrile, ethacrylonitrile, phenyl acrylonitrile, α-chloroacrylonitrile, fumaronitrile, and the like. These may be used alone or as a mixture thereof.

The aromatic vinyl copolymer resin may include the monomer copolymerizable with the aromatic vinyl monomer in an amount of about 10 wt % to about 80 wt %, for example, about 20 wt % to about 70 wt %, based on the total weight (100 wt %) of the aromatic vinyl copolymer resin. In some embodiments, the aromatic vinyl copolymer resin may include the monomer copolymerizable with the aromatic vinyl monomer in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments, the amount of the monomer copolymerizable with the aromatic vinyl monomer can be in a range from about any of the foregoing amounts to about any other of the foregoing amounts.

Within this range, the thermoplastic resin composition can exhibit good properties in terms of impact resistance, flowability, and the like.

In exemplary embodiments, the aromatic vinyl copolymer resin may have a weight average molecular weight (Mw) of about 10,000 g/mol to about 300,000 g/mol, for example, about 15,000 g/mol to about 150,000 g/mol, as measured by gel permeation chromatography (GPC). Within this range, the thermoplastic resin composition can exhibit good properties in terms of mechanical strength, formability, and the like.

In exemplary embodiments, the rubber-modified vinyl copolymer resin may include the aromatic vinyl copolymer resin in an amount of about 20 wt % or less, for example, about 10 wt % or less, based on the total weight (100 wt %) of the rubber-modified vinyl copolymer resin. In some embodiments, the rubber-modified vinyl copolymer resin may include the aromatic vinyl copolymer resin in an amount of 0 (the aromatic vinyl copolymer resin is not present), about 0 (the aromatic vinyl copolymer resin is present), 1, 2, 3, 4, 5, 6, 7, 8, 9, 10, 11, 12, 13, 14, 15, 16, 17, 18, 19, or 20 wt %. Further, according to some embodiments, the amount of the aromatic vinyl copolymer resin can be in a range from about any of the foregoing amounts to about any other of the foregoing amounts.

Within this range, the thermoplastic resin composition can exhibit good properties in terms of flowability, thermal stability, and the like.

According to exemplary embodiments, the thermoplastic resin composition may include the rubber-modified vinyl copolymer resin (B) in an amount of about 1 to about 15 parts by weight, for example, about 3 to about 10 parts by weight, relative to about 100 parts by weight of the polycarbonate resin (A). In some embodiments, the thermoplastic resin composition may include the rubber-modified vinyl copolymer resin (B) in an amount of about 1, 2, 3, 4, 5, 6, 7, 8, 9, 10, 11, 12, 13, 14, or 15 parts by weight. Further, according to some embodiments, the amount of the rubber-modified vinyl copolymer resin can be in a range from about any of the foregoing amounts to about any other of the foregoing amounts.

If the amount of the rubber-modified vinyl copolymer resin (B) is less than about 1 part by weight, the thermoplastic resin composition can suffer from deterioration in impact resistance and/or mechanical properties, and if the amount of the rubber-modified vinyl copolymer resin (B) exceeds about 15 parts by weight, the thermoplastic resin composition can suffer from deterioration in flowability, flame retardancy, and the like.

(C) Phosphorus Flame Retardant

According to exemplary embodiments, the phosphorus flame retardant may be a phosphorus flame retardant used in a typical flame retardant thermoplastic resin composition. Examples of the phosphorus flame retardant may include without limitation phosphate, phosphonate, phosphinate, phosphine oxide, and/or phosphazene compounds, and the like, and/or metal salts thereof. These compounds may be used alone or as a mixture thereof.

In exemplary embodiments, the phosphorus flame retardant may include an aromatic phosphoric acid ester compound represented by Formula 1:

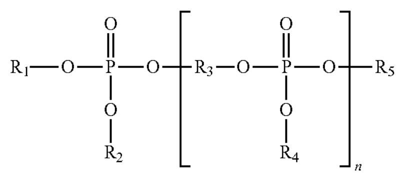

wherein $R_1$, $R_2$, $R_4$ and $R_5$ are the same or different and are each independently a hydrogen atom, a $C_6$ to $C_{20}$ aryl group, or a $C_1$ to $C_{10}$ alkyl-substituted $C_6$ to $C_{20}$ aryl group; $R_3$ is a $C_6$ to $C_{20}$ arylene group or a $C_1$ to $C_{10}$ alkyl-substituted $C_6$ to $C_{20}$ arylene group, for example, derivatives of dialcohols, such as resorcinol, hydroquinone, bisphenol-A, or bisphenol-S; and n is an integer from 0 to 10, for example, from 0 to 4.

When n is 0 in Formula 1, examples of the aromatic phosphoric acid ester compound represented by Formula 1 may include diaryl phosphates, such as diphenyl phosphate, triphenyl phosphate, tricresyl phosphate, trixylenyl phosphate, tri(2,6-dimethylphenyl) phosphate, tri(2,4,6-trimethylphenyl) phosphate, tri(2,4-di-tert-butylphenyl) phosphate, and/or tri(2,6-dimethylphenyl) phosphate, without being limited thereto. In addition, when n is 1 in Formula 1, examples of the aromatic phosphoric acid ester compound may include bisphenol-A bis(diphenyl phosphate), resorcinol bis(diphenyl phosphate), resorcinol bis[bis(2,6-dimethylphenyl) phosphate], resorcinol bis[bis(2,4-di-tert-butylphenyl) phosphate], hydroquinone bis[bis(2,6-dimethylphenyl) phosphate], and/or hydroquinone bis[bis(2,4-di-tert-butylphenyl) phosphate], without being limited thereto. These compounds may be used alone or as a mixture thereof.

In exemplary embodiments, the thermoplastic resin composition may include the phosphorus flame retardant (C) in an amount of about 10 to about 30 parts by weight, for example, about 15 to about 25 parts by weight, relative to about 100 parts by weight of the polycarbonate resin (A). In some embodiments, the thermoplastic resin composition can include the phosphorus flame retardant in an amount of about 10, 11, 12, 13, 14, 15, 16, 17, 18, 19, 20, 21, 22, 23, 24, 25, 26, 27, 28, 29, or 30 parts by weight. Further, according to some embodiments, the amount of the phosphorus flame retardant can be in a range from about any of the foregoing amounts to about any other of the foregoing amounts.

If the amount of the phosphorus flame retardant (C) is less than about 10 parts by weight, the thermoplastic resin composition can suffer from deterioration in (thin film) flame retardancy, and if the amount of the phosphorus flame retardant (C) exceeds about 30 parts by weight, the thermoplastic resin composition can suffer from deterioration in impact resistance, thermal stability, and the like.

In exemplary embodiments, the amount of the rubber-modified vinyl copolymer resin (B) may be less than the amount of the phosphorus flame retardant (C).

(D) Calcium Carbonate

Calcium carbonate is used to improve flowability, stiffness, (thin film) flame retardancy, dimensional stability, and balance between these properties of the thermoplastic resin composition in cooperation with talc.

In exemplary embodiments, the calcium carbonate may be amorphous and/or crystalline calcium carbonate. The amorphous calcium carbonate can have a larger specific surface area and a finer particle size than the crystalline calcium carbonate.

In exemplary embodiments, the calcium carbonate may be natural calcium carbonate and/or synthetic calcium carbonate. The synthetic calcium carbonate may be produced by any process known in the related art, such as a carbonation reaction process, an aqueous solution process, and the like. For example, in the aqueous solution process, an aqueous solution, in which calcium salts are dissolved, can be mixed with an aqueous solution, in which salts containing a carboxyl group are dissolved, to produce synthetic calcium carbonate through precipitation of the mixture.

In exemplary embodiments, the calcium carbonate can have an aragonite, baterite and/or calcite structure, and can have a pyramidal and/or cubic particle shape.

The calcium carbonate particles may have an average (z-average) particle size of about 0.03 μm to about 30 μm, without being limited thereto. In some embodiments, the calcium carbonate particles may have an average (z-average) particle size of about 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 μm. As used herein, the average (z-average) particle size was measured by a dry method known in the art using a Mastersizer 2000E series tester (Malvern).

In exemplary embodiments, the thermoplastic resin composition may include the calcium carbonate (D) in an amount of about 3 to about 12 parts by weight, for example, about 5 to about 10 parts by weight, relative to about 100 parts by weight of the polycarbonate resin (A). In some embodiments, the thermoplastic resin composition can include the calcium carbonate in an amount of about 3, 4, 5, 6, 7, 8, 9, 10, 11, or 12 parts by weight. Further, according to some embodiments, the amount of the calcium carbonate can be in a range from about any of the foregoing amounts to about any other of the foregoing amounts.

If the amount of the calcium carbonate (D) is less than about 3 parts by weight, the thermoplastic resin composition can suffer from deterioration in gloss, stiffness, and/or dimensional stability, and if the amount of the calcium carbonate (D) exceeds about 12 parts by weight, the thermoplastic resin composition can suffer from deterioration in impact resistance, flame retardancy, and/or mechanical properties.

(E) Talc

Talc can improve flowability, stiffness, (thin film) flame retardancy, dimensional stability, gloss, appearance characteristics, and balance between these properties of the thermoplastic resin composition in cooperation with calcium carbonate.

In exemplary embodiments, the talc may be typical flake talc. The talc may have an average (z-average) particle size of about 2 μm to about 10 μm, for example, about 3 μm to about 7 μm. In some embodiments, the talc can have an average (z-average) particle size of about 2, 3, 4, 5, 6, 7, 8, 9, or 10 μm. As used herein, the average (z-average) particle size can be measured by any dry method known in the art using a Mastersizer 2000E series (Malvern) tester.

Within this range, the thermoplastic resin composition can have good properties in terms of stiffness, dimensional stability, gloss (external appearance), and the like.

In exemplary embodiments, the talc may have a bulk density of about 0.3 to about 1.0 g/cm$^3$, for example, about 0.4 to about 0.8 g/cm$^3$. In some embodiments, the talc can have a bulk density of about 0.3, 0.4, 0.5, 0.6, 0.7, 0.8, 0.9, or 1.0 g/cm$^3$. Within this range, the thermoplastic resin composition can exhibit good properties in terms of stiffness, dimensional stability, gloss (external appearance), and the like.

In exemplary embodiments, the thermoplastic resin composition may include the talc (E) in an amount of about 5 to about 40 parts by weight, for example, about 10 to about 30 parts by weight, relative to about 100 parts by weight of the polycarbonate resin (A). In some embodiments, the thermoplastic resin composition can include the talc in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 parts by weight. Further, according to some embodiments, the amount of the talc can be in a range from about any of the foregoing amounts to about any other of the foregoing amounts.

If the amount of the talc (E) is less than about 5 parts by weight, the thermoplastic resin composition can suffer from deterioration in flowability, dimensional stability, stiffness, and the like, and if the amount of the talc (E) exceeds about 40 parts by weight, the thermoplastic resin composition can suffer from deterioration in impact resistance, mechanical properties, flame retardancy, and the like.

In exemplary embodiments, the weight ratio of the calcium carbonate (D) to the talc (E) ((D):(E)) may be about 1:1.5 to about 1:6, for example, about 1:2 to about 1:5. If the weight ratio of the calcium carbonate (D) to the talc (E) ((D):(E)) is less than about 1:1.5, the thermoplastic resin composition can suffer from deterioration in dimensional stability, flame retardancy, gloss (external appearance), and the like, and if the weight ratio of the calcium carbonate (D) to the talc (E) ((D):(E)) exceeds about 1:6, the thermoplastic resin composition can suffer from deterioration in gloss (external appearance), impact resistance, flowability, flame retardancy, dimensional stability, and the like.

(F) Black Pigment

The thermoplastic resin composition may include a black pigment having an average (z-average) particle size of about 10 nm to about 24 nm, for example, about 15 nm to about 22 nm, to provide high gloss and/or pleasant external appearance in cooperation with calcium carbonate and talc. For example, the black pigment may be carbon black. In some embodiments, the black pigment may have an average (z-average) particle size of about 10, 11, 12, 13, 14, 15, 16, 17, 18, 19, 20, 21, 22, 23, or 24 nm.

If the black pigment has an average (z-average) particle size of less than about 10 nm, the thermoplastic resin composition can suffer from deterioration in dispersion and/or mechanical properties, and if the black pigment has an average (z-average) particle size of larger than about 24 nm, the thermoplastic resin composition can suffer from deterioration in gloss and/or colors. As used herein, the average (z-average) particle size can be measured by any dry method known in the art using a Mastersizer 2000E series (Malvern) tester.

In exemplary embodiments, the thermoplastic resin composition may include the black pigment (F) in an amount of about 0.001 to about 5 parts by weight, for example, about 0.1 to about 2 parts by weight, relative to about 100 parts by weight of the polycarbonate resin (A). In some embodiments, the thermoplastic resin composition can include the black pigment in an amount of about 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments, the amount of the black pigment can be in a range from about any of the foregoing amounts to about any other of the foregoing amounts.

If the amount of the black pigment is less than about 0.001 parts by weight relative to about 100 parts by weight of the polycarbonate resin, the thermoplastic resin composition can suffer from deterioration in gloss and/or colors, and if the amount of the black pigment exceeds about 5 parts by weight, the thermoplastic resin composition can suffer from deterioration in impact resistance and/or mechanical properties.

The thermoplastic resin composition according to exemplary embodiments may further include one or more optional additives such as but not limited to release agents, nucleating agents, lubricants, plasticizers, heat stabilizers, photostabilizers, flame retardant aids, anti-dripping agents, antioxidants, and the like, and mixtures thereof.

Examples of release agents can include without limitation polyethylene waxes, fluorine-containing polymers, silicone oils, metal salt of stearic acids, metal salts of montanic acid, montanic acid ester waxes, and the like, and mixtures thereof. Examples of nucleating agents can include without limitation clay. Examples of antioxidants can include without limitation hindered phenol compounds. The additives when present may be present in an amount of about 0.1 to about 40 parts by weight, relative to about 100 parts by weight of the polycarbonate resin, without being limited thereto.

The thermoplastic resin composition according to exemplary embodiments may be prepared in pellet form by mixing the aforementioned components, followed by melt extrusion at about 200° C. to about 280° C., for example, about 250° C. to about 260° C. using a typical twin-screw type extruder.

In exemplary embodiments, the thermoplastic resin composition may have a melt-flow index (MI) of about 30 g/10 min to about 50 g/10 min, for example, about 35 g/10 min to about 45 g/10 min, as measured under conditions of 220° C. and 5 kgf in accordance with ASTM D1238.

In exemplary embodiments, the thermoplastic resin composition may have a notched Izod impact strength of about 5 kgf cm/cm or more, for example, about 5 kgf cm/cm to about 8 kgf cm/cm, as measured on a ⅛" thick specimen in accordance with ASTM D256.

In exemplary embodiments, the thermoplastic resin composition may have a glass transition temperature of about 82° C. to about 90° C., for example, about 84° C. to about 87° C.

In exemplary embodiments, the thermoplastic resin composition may have a flame retardancy of V1 or higher, as measured on a 1.0 mm thick specimen in accordance with the UL94 standard.

In exemplary embodiments, the thermoplastic resin composition may have a coefficient of linear expansion of about 20 cm/cm° C. to about 45 cm/cm° C., for example, about 25 cm/cm° C. to about 42 cm/cm° C., as measured on a 6.4 mm thick flexural specimen at 90° C. in accordance with ASTM D696.

In exemplary embodiments, the thermoplastic resin composition may have a longitudinal length of about 390 mm to about 400 mm, for example, about 396 mm to about 399 mm, as measured on an injection molded specimen prepared by injection molding at a temperature of 260° C. and at each holding pressure (30 bar, 50 bar and 70 bar) using a luminous mold having a size of 400 mm×100 mm×10 mm (length×width×thickness) so as not to form burrs, and left at 23° C. for 24 hours.

In exemplary embodiments, the thermoplastic resin composition may have a gloss (60°) of about 95% to about 100%, for example, about 96 to about 99%, as measured on an injection molded specimen at an angle of 60° in accordance with ASTM D523.

In exemplary embodiments, the thermoplastic resin composition may have a luminance (L*) of about 90 to about 100, for example, about 95 to about 99, and a* and b* of each independently about −0.1 to about 0.3, for example, about 0 to about 0.2, as measured on a 3.2 mm thick specimen in accordance with ASTM D2244.

Exemplary embodiments also include a molded article formed from the thermoplastic resin composition as set forth above.

In exemplary embodiments, the molded article may be a plastic member of a housing of an electronic product, which includes a metal frame and the plastic member adjoining at least one surface of the metal frame.

FIG. 1 is a schematic side-sectional view of a housing of an electronic product according to one embodiment of the present invention. It should be understood that the drawings are not to precise scale and the dimensions of components are exaggerated for clarity of description in the drawings. Referring to FIG. 1, the housing of an electronic product according to one embodiment includes a metal frame 10 and a plastic member 20 adjoining at least one surface of the metal frame 10, wherein the plastic member is formed of the thermoplastic resin composition according to the embodiments of the invention.

In exemplary embodiments, the metal frame 10 and the plastic member 20 may have various shapes without being limited to the shapes shown in the drawings. The metal frame 10 and the plastic member 20 form an adjoining structure in which the metal frame 10 adjoins at least one surface of the plastic member 20. The adjoining structure may be realized by bonding or insertion, but is not limited thereto.

In exemplary embodiments, the metal frame 10 may be a stainless steel frame or may be selected from among any commercially available products, which can be applied to a typical housing of electronic products.

In exemplary embodiments, the plastic member 20 may be formed of the polycarbonate resin composition by various molding methods such as injection molding, extrusion molding, vacuum molding, casting, and the like. For example, the plastic member 20 may be formed by heat molding, steam molding (RHCM (rapid heat cycle molding)), or the like, and may be a front cover or a rear cover of a 22" to 75" thin film-type TV, a thin film-type monitor, and the like. The plastic member 20 can exhibit high gloss to be suitably applied to high gloss products (having a gloss of about 98%) and allows application of appearance patterns such as a hairline pattern, a corrosion pattern, and the like.

Next, the present invention will be described in more detail with reference to the following examples. It should be understood that these examples are provided for illustration only and are not to be construed in any way as limiting the present invention. Descriptions of details apparent to those skilled in the art will be omitted.

EXAMPLE

Details of components used in Examples and Comparative Examples are as follows.

(A) Polycarbonate Resin

A bisphenol-A polycarbonate resin (melt-flow index: 60±10 g/10 min, as measured at 300° C. under a load of 1.2 kg in accordance with ISO 1133)) is used.

(B) Rubber-Modified Vinyl Copolymer Resin

A rubber-modified aromatic vinyl graft copolymer (g-MBS) obtained by grafting 25 wt % of styrene and 15 wt % of methyl methacrylate to 60 wt % of polybutadiene rubber (PBR) having a Z-average of 310 nm is used.

(C) Phosphorus Flame Retardant

Oligomer-type bisphenol-A diphosphate (YOkE BDP, Yoke Chemical Co., Ltd.) is used.

(D) Calcium Carbonate

Calcium carbonate (Product name: 2B, OMYA Co., Ltd.) is used.

(E) Talc

Talc (Product name: KCM 6300, bulk density: 0.4 to 0.6 g/cm$^3$, KOCH Co., Ltd.) is used.

(F) Black Pigment (F1) Carbon black (Product name: High Black 50L, average (z-average) particle size: 19 nm, Orion Co., Ltd.) is used.

(F2) Carbon black (Product name: High Black 80L, average (z-average) particle size: 27 nm, Orion Co., Ltd.) is used.

Examples 1 to 3 and Comparative Examples 1 to 4

The above components are mixed in amounts as listed in Table 1, followed by extrusion at 250° C. to prepare pellets. Here, extrusion is performed using a twin-screw extruder having L/D of 36 and a diameter of 45 mm. The prepared pellets are dried at 80° C. for 4 hours or more, followed by injection molding using a 6 oz. injection machine (molding temperature: 250° C. to 260° C., mold temperature: 60° C.), thereby preparing a specimen. The prepared specimen is evaluated as to the following properties, and results are shown in Table 1.

Property Evaluation (1) Melt-flow index (MI, unit: g/10 min): Melt-flow index is measured at 220° C. under a load of 5 kgf in accordance with ASTM D1238.

(2) Notched Izod impact strength (unit: kgf·cm/cm): Izod impact strength is measured on a ⅛" thick notched Izod specimen in accordance with ASTM D256.

(3) Glass transition temperature (unit: ° C.): In a Q20 instrument (Differential Scanning calorimeter (DSC), TA), 5 to 10 mg of a sample is dried at 80° C. in a vacuum (vapor: 3,000 ppm or less) for 4 hours, heated from 30° C. to 400° C. at a heating rate of 20° C./min in a nitrogen atmosphere, left at 400° C. for 1 minute, cooled to 30° C. at a cooling rate of 20° C./min, and left at 30° C. for 1 minute. Then, glass transition temperature is measured based on transition temperature while heating the sample to 400° C. at a heating rate of 20° C./min (2$^{nd}$ scan).

(4) Flame retardancy: Flame retardancy is measured using 1.0 mm thick specimens in accordance with the UL 94 Flammability Testing Standard.

(5) Coefficient of linear expansion (unit: cm/cm° C.): Coefficient of linear expansion is measured on a 6.4 mm thick flexural specimen at 90° C. in accordance with ASTM D696.

(6) Luminous flat mold dimensional evaluation (unit: mm): Longitudinal length of an injection molded specimen is measured. The specimen is prepared by injection molding at a molding temperature of 260° C. and at each holding pressure (30 bar, 50 bar and 70 bar) using a luminous mold having a size of 400 mm×100 mm×10 mm (length×width×thickness) so as not to form burrs, and left at 23° C. for 24 hours.

(7) Gloss)(60° (unit: %): Gloss is measured on a specimen prepared by injection molding and having a size of 90 mm×50 mm×2 mm using a MG-268 gloss meter (Konica Minolta Co., Ltd.) in accordance with ASTM D523.

(8) Color (Luminance (L*) and chroma (a* and b*)): Luminance (L*) and chroma (a* and b*) are measured on a 3.2 mm thick injection-molded specimen using a colorimeter (CM-3600d, Konica Minolta Co., Ltd.) in specular component excluded (SCE) mode in accordance with ASTM D2244.

TABLE 1

| | Example 1 | Example 2 | Example 3 | Comparative Example 1 | Comparative Example 2 | Comparative Example 3 | Comparative Example 4 |
|---|---|---|---|---|---|---|---|
| (A) (parts by weight) | 100 | 100 | 100 | 100 | 100 | 100 | 100 |
| (B) (parts by weight) | 6 | 6 | 6 | 6 | 6 | 6 | 6 |
| (C) (parts by weight) | 21 | 21 | 21 | 21 | 21 | 21 | 21 |
| (D) (parts by weight) | 5 | 10 | 5 | 3 | 12 | 3 | 10 |
| (E) (parts by weight) | 10 | 20 | 25 | 3.9 | 5 | 30 | 20 |
| (F1) (parts by weight) | 1 | 1 | 1 | 1 | 1 | 1 | — |
| (F2) (parts by weight) | — | — | — | — | — | — | 1 |
| (D):(E) (weight ratio) | 1:2 | 1:2 | 1:5 | 1:1.3 | 1:0.42 | 1:10 | 1:2 |
| Melt-flow index | 45 | 40 | 35 | 47 | 30 | 30 | 40 |
| Notched Izod impact strength | 8 | 6 | 5 | 6 | 6 | 4 | 6 |
| Glass transition temperature | 85 | 85 | 85 | 85 | 83 | 85 | 85 |
| Flame retardancy (1.0 T) | V1 | V1 | V1 | V1 | V2 | V2 | V1 |
| Coefficient of linear expansion | 41 | 35 | 30 | 50 | 55 | 50 | 35 |
| Luminous flat mold dimensional evaluation | 396 | 398 | 399 | 388 | 385 | 395 | 398 |
| Gloss | 98 | 98 | 98 | 98 | 95 | 85 | 90 |
| L* | 98 | 98 | 98 | 98 | 98 | 95 | 95 |
| a* | 0.1 | 0.1 | 0.1 | 0.1 | 0.1 | 0.1 | 0.2 |
| b* | 0.1 | 0.1 | 0.1 | 0.1 | 0.5 | 0.6 | 1.0 |

From Table 1, the thermoplastic resin compositions according to the present invention exhibit good properties in terms of flowability (molding processability), impact resistance, thermal resistance, thin film flame retardancy, appearance characteristics such as gloss, color, and the like, dimensional stability, and balance therebetween.

Conversely, the thermoplastic resin composition of Comparative Example 1, in which the weight ratio of calcium carbonate to talc was 1:1.3 (less than 1:1.5) and talc is present in a small amount (3.9 parts by weight), suffers from deterioration in dimensional stability (coefficient of linear expansion and luminous flat mold dimensional evaluation). The thermoplastic resin composition of Comparative Example 2, in which the weight ratio of calcium carbonate to talc is 1:0.42 (less than 1:1.5), suffers from significant deterioration in dimensional stability and also suffers from deterioration in flame retardancy, appearance characteristics, and the like. The thermoplastic resin composition of Comparative Example 3, in which the weight ratio of calcium carbonate to talc is 1:10 (higher than 1:6), generally suffers from deterioration in gloss, impact resistance, dimensional stability, flame retardancy, appearance characteristics, and the like. Further, the thermoplastic resin composition of Comparative Example 4, which is prepared using a black pigment (F2 carbon black) having an average particle size of larger than 27 nm, suffers from deterioration in appearance characteristics such as gloss and colors.

Exemplary embodiments have been disclosed herein, and although specific terms are employed, they are to be interpreted in a generic and descriptive sense only and not for purpose of limitation. Also although some embodiments have been described above, it should be understood that these embodiments are provided for illustration only and are not to be construed in any way as limiting the present invention, and that various modifications, changes, alterations, and equivalent embodiments can be made by those skilled in the art without departing from the spirit and scope of the invention. The scope of the present invention should be defined by the appended claims and equivalents thereof.

What is claimed is:

1. A thermoplastic resin composition comprising:

about 100 parts by weight of a polycarbonate resin;

about 1 to about 15 parts by weight of a rubber-modified vinyl copolymer resin;

about 10 to about 30 parts by weight of a phosphorus flame retardant;

about 3 to about 12 parts by weight of calcium carbonate;

about 5 to about 40 parts by weight of talc; and about 0.001 to about 5 parts by weight of a black pigment, wherein a weight ratio of calcium carbonate to talc ranges from about 1:1.5 to about 1:6 and the black pigment has an average particle size of about 10 nm to about 24 nm.

2. The thermoplastic resin composition according to claim 1, wherein the rubber-modified vinyl copolymer resin comprises a rubber-modified aromatic vinyl graft copolymer obtained by grafting an aromatic vinyl monomer and an alkyl (meth)acrylate monomer to a rubber polymer.

3. The thermoplastic resin composition according to claim 1, wherein the phosphorus flame retardant comprises at least one selected from among phosphate, phosphonate, phosphinate, phosphine oxide, and phosphazene compounds.

4. The thermoplastic resin composition according to claim 1, wherein the rubber-modified vinyl copolymer resin is present in a lower amount than the phosphorus flame retardant.

5. The thermoplastic resin composition according to claim 1, wherein the thermoplastic resin composition has a melt-flow index (MI) of about 30 g/10 min to about 50 g/10 min, as measured at 220° C. under a load of 5 kgf in accordance with ASTM D1238, and a notched Izod impact strength of about 5 kgf·cm/cm or more, as measured on a ⅛" thick specimen in accordance with ASTM D256.

6. The thermoplastic resin composition according to claim 1, wherein the thermoplastic resin composition has a glass transition temperature of about 82° C. to about 90° C. and a flame retardancy of V1 or higher, as measured on a 1.0 mm thick specimen in accordance with the UL94 standard.

7. The thermoplastic resin composition according to claim 1, wherein the thermoplastic resin composition has a coefficient of linear expansion of about 20 cm/cm° C. to about 45 cm/cm° C., as measured on a 6.4 mm thick flexural specimen at 90° C. in accordance with ASTM D696, and a longitudinal length of about 390 mm to about 400 mm, as measured on a specimen prepared by injection molding at a temperature of 260° C. and at each holding pressure (30 bar, 50 bar and 70 bar) using a luminous mold having a size of 400 mm×100 mm×10 mm (length×width×thickness) so as not to form burrs, and left at 23° C. for 24 hours.

8. The thermoplastic resin composition according to claim 1, wherein the thermoplastic resin composition has a gloss (60°) of about 95% to about 100%, as measured on an injection molded specimen at an angle of 60° in accordance with ASTM D523, and a luminance (L*) of about 90 to about 100, a* of about −0.1 to about 0.3, and b* of about −0.1 to about 0.3, as measured on a 3.2 mm thick specimen in accordance with ASTM D2244.

9. A molded article formed from the thermoplastic resin composition according to claim 1.

10. The molded article according to claim 9, wherein the molded article is a plastic member of a housing of an electronic product, the housing comprising a metal frame and the plastic member adjoining at least one surface of the metal frame.

* * * * *